(12) United States Patent
McIntyre et al.

(10) Patent No.: US 10,037,835 B2
(45) Date of Patent: Jul. 31, 2018

(54) QUENCH PROTECTED STRUCTURED SUPERCONDUCTING CABLE

(71) Applicant: The Texas A&M University System, College Station, TX (US)

(72) Inventors: Peter McIntyre, Bryan, TX (US); Akhdiyor Sattarov, College Station, TX (US); Thomas Mann, College Station, TX (US); James Gerity, College Station, TX (US); Klaus Smit, College Station, TX (US); Daniel Chavez, College Station, TX (US); Nathaniel Pogue, College Station, TX (US); Michael Tomsic, Columbus, OH (US)

(73) Assignee: The Texas A&M University System, College Station, TX (US)

( * ) Notice: Subject to any disclaimer, the term of this patent is extended or adjusted under 35 U.S.C. 154(b) by 260 days.

(21) Appl. No.: 14/824,882

(22) Filed: Aug. 12, 2015

(65) Prior Publication Data
US 2016/0049225 A1    Feb. 18, 2016

Related U.S. Application Data

(60) Provisional application No. 62/036,146, filed on Aug. 12, 2014.

(51) Int. Cl.
*H01B 12/06* (2006.01)
*H01L 39/14* (2006.01)
*H01F 6/02* (2006.01)

(52) U.S. Cl.
CPC ............ *H01B 12/06* (2013.01); *H01L 39/14* (2013.01); *H01L 39/141* (2013.01); *H01L 39/143* (2013.01); *H01F 6/02* (2013.01); *Y02E 40/642* (2013.01)

(58) Field of Classification Search
None
See application file for complete search history.

(56) References Cited

U.S. PATENT DOCUMENTS

| 6,448,501 B1 * | 9/2002 | McIntyre | ............... | H01B 12/16 174/125.1 |
| 6,687,975 B2 | 2/2004 | Tomsic | | |
| 7,986,925 B2 * | 7/2011 | Alford | ................. | H04B 17/101 455/115.1 |

FOREIGN PATENT DOCUMENTS

WO    WO 2014/109803 A2    7/2014

OTHER PUBLICATIONS

McInturff et al. ("50 Tesla Superconducting Solenoid for Fast Muon Cooling Ring", Particle Accelerator Conference, 2007. PAC. IEEE, Issue Date: Jun. 25-29, 2007, pp. 1757-1759; Written by: McInturff, A.; McIntyre, P.; Sattarov, A.*

(Continued)

*Primary Examiner* — Colleen P Dunn
(74) *Attorney, Agent, or Firm* — Saliwanchik, Lloyd & Eisenschenk

(57) ABSTRACT

Quench protected structured (QPS) superconducting cables, methods of fabricating the same, and methods of bending the same are disclosed. The methods of bending the QPS superconducting cables can be employed to produce windings. The QPS superconducting cables can rapidly drive a distributed quench to a normal conducting state in a superconducting cable if a region of the cable spontaneously quenches during high current operation.

19 Claims, 12 Drawing Sheets

(56) References Cited

OTHER PUBLICATIONS

Bessette, D., "Design of a $Nb_3Sn$ cable-in-conduit conductor to withstand the 60000 electromagnetic cycles of the ITER Central Solenoid", *IEEE Trans. Appl. Superconductivity*, 24, 3, 4200505 (2014).

Dixon, L.R. et al., "Reaction heat treatment and epoxy impregnation of a large $Nb_3Sn$ CICC coil for a series-connected hybrid magnet", *IEEE Trans. Appl. Superconductivity*, 24, 3, 4300505 (2014).

Fischer, D.E. et al., Superconducting SIS100 prototype magnets, *IEEE Trans. Appl. Supercond.* 20, 3, 218-221 (2010).

Kersevan, R. "Synchrotron Radiation and Vacuum Issues for Future Hadron Colliders," Powerpoint slide for talk: "Synchrotron radiation & vacuum concepts," Future Circular Collider Study Kickoff Meeting.

Khodzhibagiyan, H.G. et al., Design and test of a hollow superconducting cable based on keystoned NbTi composite wires, IEEE Trans. Appl. Superconductivity 15, 2, 1529-1532, (2005).

Kwasnitza, K. "AC losses of a 10 kA NbTi cable-in-conduit superconductor for SMES applications," *Cryogenics*, 36, 1, 27-34 (1996).

Li, Qiang, "Superconducting Magnetic Energy Storage (SMES) Systems for GRIDS," Powerpoint Slide: Tenth EPRI Superconductivity Conference, Tallahassee, FL, Oct. 12, 2011, http://www.superpower-inc.com/system/files/2011_1012+EPRI+Conf_Brookhaven+SMES.pdf.

Libeyre, P. et al., An optimized Central Solenoid for ITER, IEEE Trans. Appl. Superconduct. 20, 3, 398-401, (2010).

Lelekhov, S.A. et al., "AC loss before and after cyclic mechanical loading in the ITER RF CICCs," *IEEE Trans. Appl. Superconductivity*, 24, 3, 4201005 (2014).

Mitchell, D. et al., "Reversible and irreversible mechanical effects in real cable-il1-conduit conductors," Supercond. Sci. Technol. 26, 114004 (2013).

Nijhuis, A. et al., Performance of an ITER CSI model coil conductor under transverse cyclic loading up to 40,000 cycles, IEEE Trans. Appl. Superconduct. 14, 2, 1489 (2004).

Nijhuis, A. et al., "The effect of axial and transverse loading on the transport properties of ITER $Nb_3Sn$ strands;" Supercond. Sci. Technol. 26, 084004 (2013).

"Superconducting Cable Systems," Powerpoint slide, http://www.nexans.de/eservice/Germany-de_DE/:fileLibrary/Download_540144810/Germany/files/Nexans_Superconducting_cable_systems.pdf.

Yagai, T. et al., "Investigation of frictional force applied to strands surrounded by other strands and tribological analysis of contact surface in CIC conductor", IEEE Trans. Appl. Superconductivity, 24, 3, 8800404 (2014).

Yumma, H. et al., "Update of Yokohama HTS Cable Project", *IEEE Trans. Appl. Superconductivity*, 23, 3, 5402306-5402306, (2013).

Study Kickoff Meeting, Geneva, Feb. 12-14, 2014, [online webpage, retrieved Jan. 5, 2016] from: https://indico.cern.ch/event/282344/overview.

* cited by examiner

QUENCH PROTECTED STRUCTURED SUPERCONDUCTING CABLE

CROSS-REFERENCE TO A RELATED APPLICATION

The present application claims the benefit of U.S. Provisional Application Ser. No. 62/036,146, filed Aug. 12, 2014, which is incorporated by reference herein in its entirety, including any figures, tables, and drawings.

BACKGROUND

Cable in conduit (CIC) geometries are currently used to fabricate superconducting cables. Quenching is a problem in superconducting cables. Quenching is an abnormal termination of magnet operation that occurs when part of the superconducting cable enters a resistive state. The part of the superconducting cable in which the quench occurs undergoes rapid Joule heating, causing regions of the superconducting cable surrounding the quench to enter a resistive state. This causes additional Joule heating, leading to a chain reaction, in which increasingly large sections of the superconducting cable enter a resistive state. Existing techniques are not able to externally induce a distributed quench in a CIC conductor and instead either add a substantial amount of stabilizing copper within the CIC conductor or limit the overall performance to avoid the potential for a quench to damage the windings.

BRIEF SUMMARY

The subject invention provides novel and advantageous quench protected structured (QPS) superconducting cables, methods of fabricating the same, methods of using the same, and methods of bending the same that can solve the aforementioned problems. Embodiments of the subject invention can rapidly force a distributed quench throughout a superconducting cable, which is beneficial at least in part because any Joule heating and/or voltage fluctuation can be distributed throughout the superconducting cable rather than concentrated at a particular point. Rapidly forcing a distributed quench throughout a superconducting cable avoids or inhibits the damage likely to otherwise occur if a quench occurs spontaneously at a single point in the superconducting cable.

In one embodiment, a QPS superconducting cable can include: a spring tube; a plurality of superconducting wires disposed around the spring tube; and a sheath surrounding the plurality of superconducting wires and the spring tube, wherein the spring tube comprises a plurality of perforations. The QPS superconducting cable can further include a plurality of quench heater wires, wherein each quench heater of the plurality of quench heater wires is a resistive wire that generates heat as current passes through it. The plurality of quench heater wires can be distributed among the plurality of superconducting wires within the sheath or provided external to the sheath.

In another embodiment, a method of bending a QPS superconducting cable can include: evacuating the spring tube to create at least a partial vacuum; filling the spring tube with water; cooling the QPS superconducting cable to freeze the water; bending the QPS superconducting cable; warming the QPS superconducting cable to room temperature; draining the water; and evacuating the QPS superconducting cable to at least a partial vacuum to remove any residual water. Such a method can result in bending the QPS superconducting cable to an angle of about 180° with a ratio of radius of curvature to sheath radius of 7:1 or less.

In another embodiment, a method of compacting a sheath of a QPS superconducting cable onto internal components of the QPS superconducting cable can include: drawing the sheath through a forming die in a succession of reducing deformations until the plurality of superconducting wires compress the spring tube by a small displacement so that each of the plurality of superconducting wires are immobilized in an annular space between the sheath and the spring tube, and each of the neighboring wires of the plurality of superconducting wires are compacted against one another so that a controlled electrical contact is established among the neighboring wires of the plurality of superconducting wires.

Further details and advantages of the disclosure become apparent in the following description of various preferred embodiments by way of the attached drawings. The drawings are included for purely illustrative purposes and are not intended to limit the scope of the present disclosure.

DETAILED DESCRIPTION

The subject invention provides novel and advantageous quench protected structured (QPS) superconducting cables, methods of fabricating the same, methods of using the same, and methods of bending the same that can solve the aforementioned problems. Embodiments of the subject invention can rapidly force a distributed quench throughout a superconducting cable, which is beneficial at least in part because any Joule heating and/or voltage fluctuation can be distributed throughout the superconducting cable rather than concentrated at a particular point. Rapidly forcing a distributed quench throughout a superconducting cable avoids or inhibits the damage likely to otherwise occur if a quench occurs spontaneously at a single point in the superconducting cable.

When the term "about" is used herein, in conjunction with a numerical value, it is understood that the value can be in a range of 95% of the value to 105% of the value, i.e. the value can be +/−5% of the stated value. For example, "about 1 kg" means from 0.95 kg to 1.05 kg.

Figure 1:
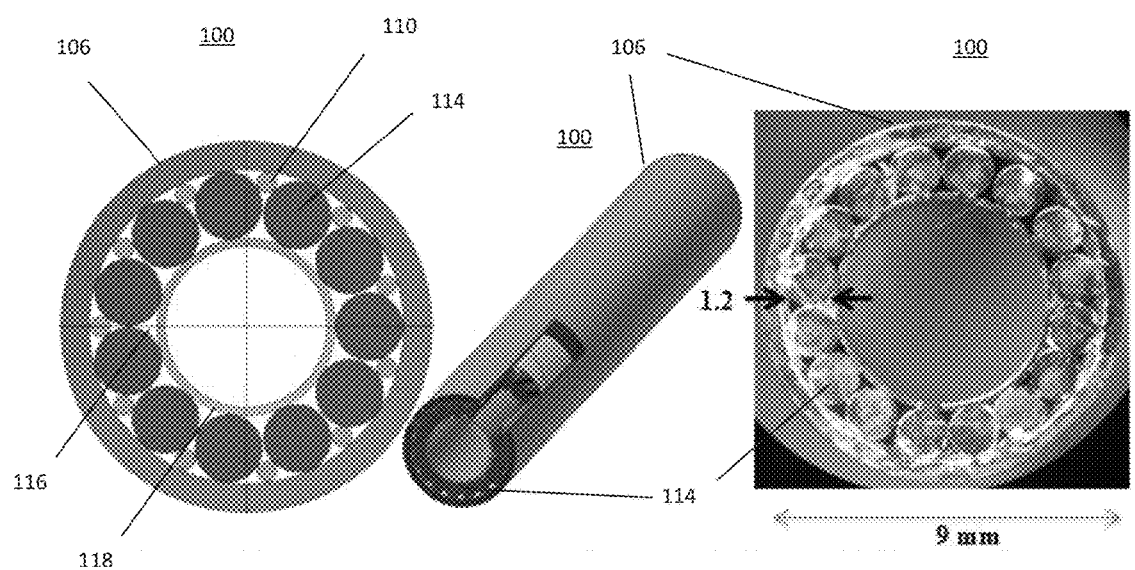
FIG. 1 shows a cross-sectional view, a schematic view, and a cross-sectional image of QPS superconducting cables according to embodiments of the subject invention.

FIG. 1 shows a cross-sectional view (left), a schematic view (middle), and a cross-sectional image (right) of QPS superconducting cables according to embodiments of the subject invention. Referring to FIG. 1, in an embodiment, a QPS superconducting cable 100 can include a plurality of superconducting wires 114, a plurality of quench heater wires 110, and a spring tube 118. The spring tube 118 can be interspersed among the plurality of superconducting wires 114 and/or the plurality of quench heater wires 110. For example, the spring tube 118 can be positioned in the middle (e.g., in a radial sense of the QPS superconducting cable) of the superconducting wires 114 and/or the quench heater wires 110. The spring tube 118 can be positioned along or near a central axis of the QPS superconducting cable. A sheath 106 can be included and can encase the superconducting wires 114, the quench heater wires 110, and the spring tube 118. In a further embodiment, the spring tube 118 can contain perforations. The spring tube 118 can be filled with a material, for example a cryogenic material, which can then pass through the perforations in the spring tube 118, filling interstitial space 116 separating the spring tube 118, the plurality of superconducting wires 110, and the plurality of quench heater wires 110.

The plurality of quench heater wires 110 are optional and can be excluded. If present, the heater wires 110 can provide the heat necessary to rapidly force quench throughout the QPS superconducting cable 100. If a quench is detected in the QPS superconducting cable 100, the plurality of quench heater wires 110 can be activated to heat the QPS superconducting cable 100 to mitigate damage to the QPS superconducting cable 100 induced by a singular quench point.

Although FIG. 1 depicts a QPS superconducting cable 100 with a plurality of quench heater wires 110 interspersed among a plurality of superconducting wires 114, in another embodiment, the quench heater wires 110 can be located externally to the sheath 106. Whether the quench heater wires 110 are interspersed among the plurality of superconducting wires 114 or located on the surface of the sheath 106 can depend on, e.g., the quench velocity $v_q$ with which a quench that starts at one location in a winding can propagate along the winding. The dynamics of quench propagation are a balance between the Joule heating in the quenched region as current bypasses through the conducting (e.g., copper) portion of a wire composition, the heat conduction through that copper, the heat capacity ($\sim T^3$) of the wire, and the transition temperature at which a superconducting segment is quenched to the normal state.

In an embodiment, the interstitial space 116 within the sheath 106 can be impregnated with a material. For example, the interstitial space 116 can be impregnated with an epoxy, though embodiments are not limited thereto. The interstitial space 116 can be impregnated with the material via, for example, a vacuum method, though embodiments are not limited thereto. In one embodiment, the interstitial space 116 within the sheath 106 can be vacuum impregnated with epoxy.

The superconducting wires 114 and/or quench heater wires 110 can have voids within the wires themselves. In one embodiment, the voids within the superconducting wires 114 and/or quench heater wires 110 can be un-impregnated. In an alternative embodiment, the voids within the superconducting wires 114 and/or quench heater wires 110 can be impregnated (e.g., vacuum impregnated) with a material.

Referring to the image (right-hand side) in FIG. 1, a QPS superconducting cable 100 can have a small size. The image of the wire depicted shows a diameter, including the sheath 106 of 9 mm, with each superconducting wire 114 having a diameter of 1.2 mm. These diameters are provided for exemplary purposes only and should not be construed as limiting. The sheath 106, each superconducting wire 114, the spring tube 118, and each quench heater wire 110 can have a diameter of, for example, any of the following values, about any of the following values, at least any of the following values, at least about any of the following values, not more than any of the following values, not more than about any of the following values, or within any range having any of the following values as endpoints (with or without "about" in front of one or both of the endpoints), though embodiments are not limited thereto (all numerical values are in percentage by weight (mm)): 0.01, 0.1, 0.5, 0.8, 0.9, 1.0, 1.1, 1.2, 1.3, 1.4, 1.5, 1.6, 1.7, 1.8, 1.9, 2, 3, 4, 5, 6, 7, 8, 9, 10, 11, 12, 13, 14, 15, 16, 17, 18, 19, 20, 25, 30, 35, 40, or 50, though embodiments are not limited thereto. Of course, the diameter of the sheath will be greater than that of the spring tube 118 and each superconducting wire 114 for any given QPS superconducting cable 100 (in cases where the quench heater wires 110 are present within the sheath 106, the sheath 106 will also have a larger diameter than that of each quench heater wire 110).

The superconducting wires 114 can be any suitable shape (e.g., flat ribbons or cylindrical). The superconducting wires 114 can include, for example, at least one of the following materials: Cu, Ag, Au, Pt, Pd, NbTi, NbTi/Cu, $Nb_3Sn$, $Nb_3Sn$/Cu, Bi-2212, Bi-2212/Ag, $MgB_2$, Monel, $MgB_2$/Monel, ferropnictide, Bi-2223, YBCO, and rare-earth-based bariumcarbonates (ReBCO), though embodiments are not limited thereto.

In an embodiment, a QPS superconducting cable can further include at least one layer of thermally conducting and electrically insulating tape around (e.g., spiral-wrapped around) the plurality of superconducting wires, the plurality of quench heater wires, and the spring tube within the sheath.

In an embodiment, a QPS superconducting cable can further include a plurality of resistive wires cabled with the plurality of superconducting wires so that a first resistive wire of the plurality of resistive wires is located at a V-crevice formed between two contiguous superconducting wires of the plurality of superconducting wires, so that a radius of an outermost point on the first resistive wire from the center of the cable equals or is approximately equal to the radius (from the center of the cable) of an outermost point on the two contiguous superconducting wires. The plurality of resistive wires can be equal in number to the plurality of superconducting wires. Each resistive wire of the plurality of resistive wires can include a metal alloy (e.g., stainless steel of Monel). In a further embodiment, the plurality of resistive wires can be coated with an insulator. The insulator can be, for example, a ceramic, a glass, and/or a polymer (e.g., a uniform film of a ceramic, a glass, or a polymer).

In an embodiment, the sheath can include a fiber-glass cloth and/or and a fiberglass tape applied to an outer surface of the internal components (e.g., the plurality of superconducting wires).

superconducting cable according to embodiments of the subject invention. The rows show examples of parameter values (units are shown in the far-right column, when applicable) for each application, and the first row shows example materials for the superconducting wire(s) for each application. The values and materials provided for each application are for exemplary purposes only and should not be construed as limiting. Referring to Table 2, if the QPS superconducting cable is to be used as a particle collider dipole, then the plurality of superconducting wires can include NbTi. If the QPS superconducting cable is to be used for magnetic energy storage, then the plurality of superconducting wires can include $MgB_2$. In each case listed in Table 1, the superconducting wires can also include another conductive element (e.g., copper).

TABLE 1

Example parameters for different applications of QPS superconducting cable

|  | Collider dipole | Proton therapy gantry | Magnetic energy storage | Transmission line | Tokamak solenoid | |
| --- | --- | --- | --- | --- | --- | --- |
| superconductor | NbTi | $MgB_2$ | $MgB_2$ | $MgB_2$ | $Nb_3Sn$ |  |
| Operating field | 4.5 | 3 | 3 | 1 | 13 | T |
| Cable current | 20 |  | 50 | 15 | 40 | kA |
| Operating temp | 4.5 | 15 | 20 | 20 | 5 | K |
| # wires | 17 | 11 | 25 | 25 | 6 × 180 |  |
| # turns | 10 | 40 | 180 | 1 |  |  |
| # windings | 2 | 2 | 1 | 3 |  |  |
| Quench velocity | 83 | 6.5 | 6.5 |  |  | m/s |
| Unit length | 20 | 3.1 | 4 | 100 |  | m |
| Stored energy | 1.3 | 0.2 | 100 |  |  | MJ |
| Quench protect | External @ ends | Internal wires | External strips | Internal wires |  |  |

Figure 2:
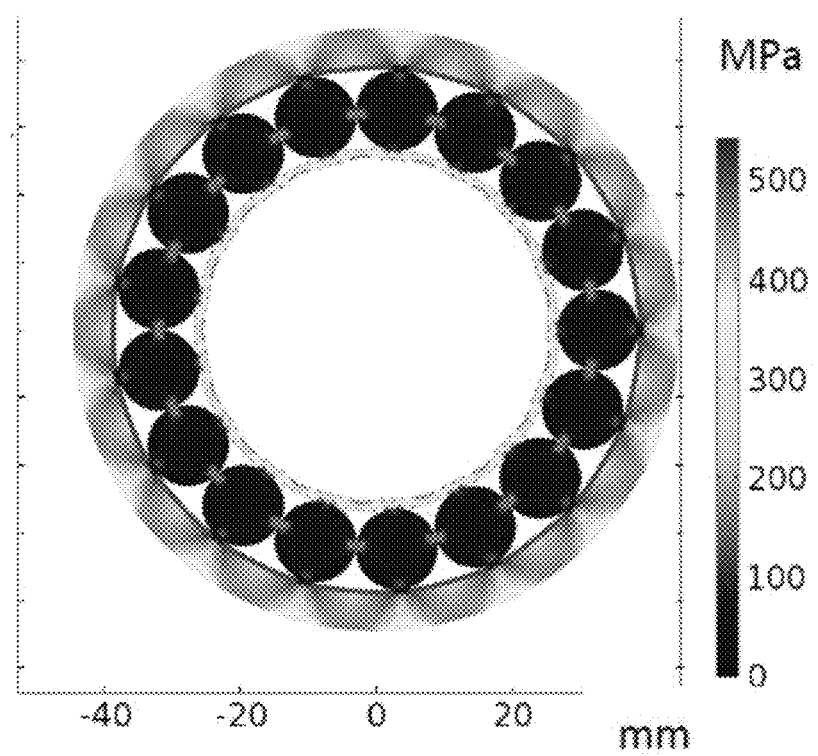
FIG. 2 shows a cross-sectional view illustrating stress on components of a QPS superconducting cable according to an embodiment of the subject invention, after a sheath is placed on the components.
Figure 3:
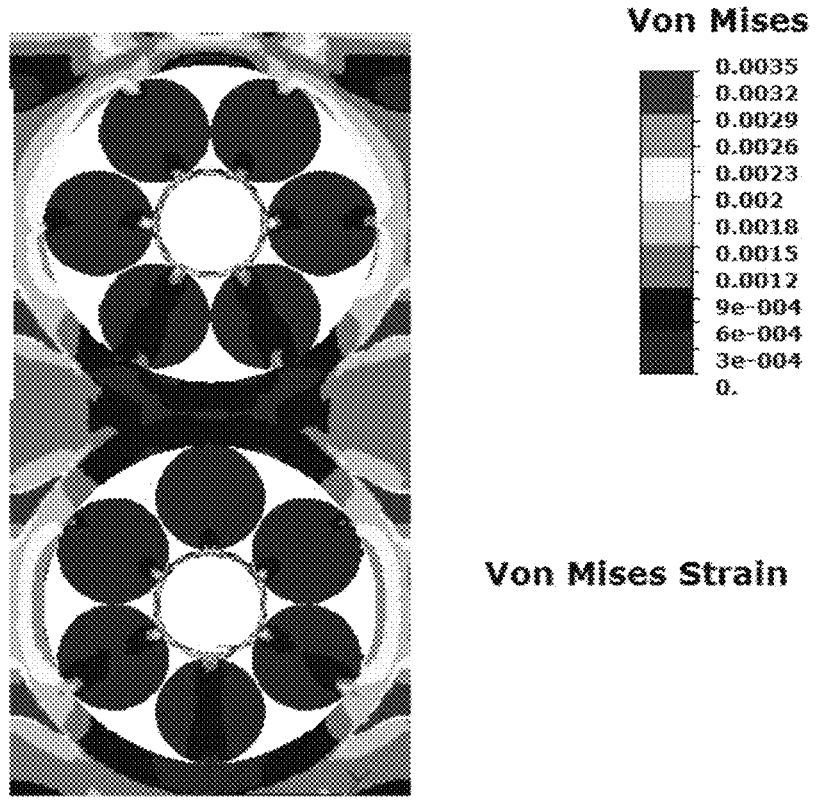
FIG. 3 shows a schematic view illustrating von Mises stress on components of a QPS superconducting cable according to an embodiment of the subject invention.

QPS superconducting cables of the subject invention are designed to manage stresses. The mechanical support is provided by the stress management that is integrated into the QPS superconducting cable itself. The material or materials from which the sheath is fabricated can be selected to provide robust mechanical strength to support the hoop stress of Lorentz loading and the accumulation of load passed radially through multiple layers of a winding. FIG. 2 shows stress on components of a QPS superconducting cable according to an embodiment of the subject invention, after a sheath is placed on the components to compress the wires (e.g., superconducting wires) against the spring tube. FIG. 3 shows von Mises stress on components of a QPS superconducting cable in which the interstitial space (116) within the sheath is vacuum impregnated with epoxy and the voids within the superconducting wires and quench heater wires are un-impregnated. Referring to FIG. 2, the plastic deformation of the sheath and the local elastic compression of the spring tube are evident; the plurality of superconducting wires and the plurality of quench heater wires themselves can be immobilized with very little internal stress. Referring to FIG. 3, the sheath can act as a stress bridge to protect the plurality of superconducting wires and quench heater wires from being strained.

The superconducting wire(s) used in the QPS superconducting cable can be any suitable material, including but not limited to NbTi, $MgB_2$, and $Nb_3Sn$. The choice of material for the superconducting wire(s) used in the QPS superconducting cable can depend on the specific application for which the QPS superconducting cable is used. Table 1 shows a plurality of non-limiting applications (columns) for a QPS In some embodiments, the QPS superconducting cable can include a single-layer array of superconducting wires cabled together onto a spring tube. The superconducting wires can be cabled together with, for example, a twist pitch. The spring tube can be a thin-walled spring tube. For example, the spring tube can be a gold (Au) spring tube, though embodiments are not limited thereto.

In one embodiment, a QPS superconducting cable can include a single-layer array of superconducting wires cabled together onto a spring tube. The superconducting wires can be cabled together with, for example, a twist pitch. The spring tube can be a thin-walled spring tube (e.g., a gold spring tube). The QPS superconducting cable can be fabricated by cabling strands of NbTi/Cu superconducting wires onto a thin-walled (e.g., 150 µm) perforated Monel spring tube, and inserting the superconducting wires and spring tube into an outer Monel sheath. The Monel sheath can then be drawn down onto the strands of NbTi/Cu superconducting wires and the thin-walled perforated Monel spring tube to load the strands into compression against the Monel spring tube so that they are immobilized. Cryogen can flow through the spring tube during operation and can permeate the interstitial space between the superconducting wires and spring tube by flowing through the perforations in the spring tube. The sheath can be formed using, for example, the method of continuous tube-forming (CTFF) disclosed in U.S. Pat. No. 6,687,975, which is incorporated herein by reference in its entirety. The CTFF method can include forming a metal strip into a continuous tube and seam-welding the strip using a method that does not damage the superconducting wires inside. Such a method allows for sheathing of a cable of any length without having to pull it through an existing sheath tube. The sheath can then be drawn down onto the cable to compress the cable wires against the spring tube and immobilize them. Other methods can be used to extrude the plurality of superconducting wires, a plurality of quench heater wires, and the spring tube through a sheath.

Figure 4:
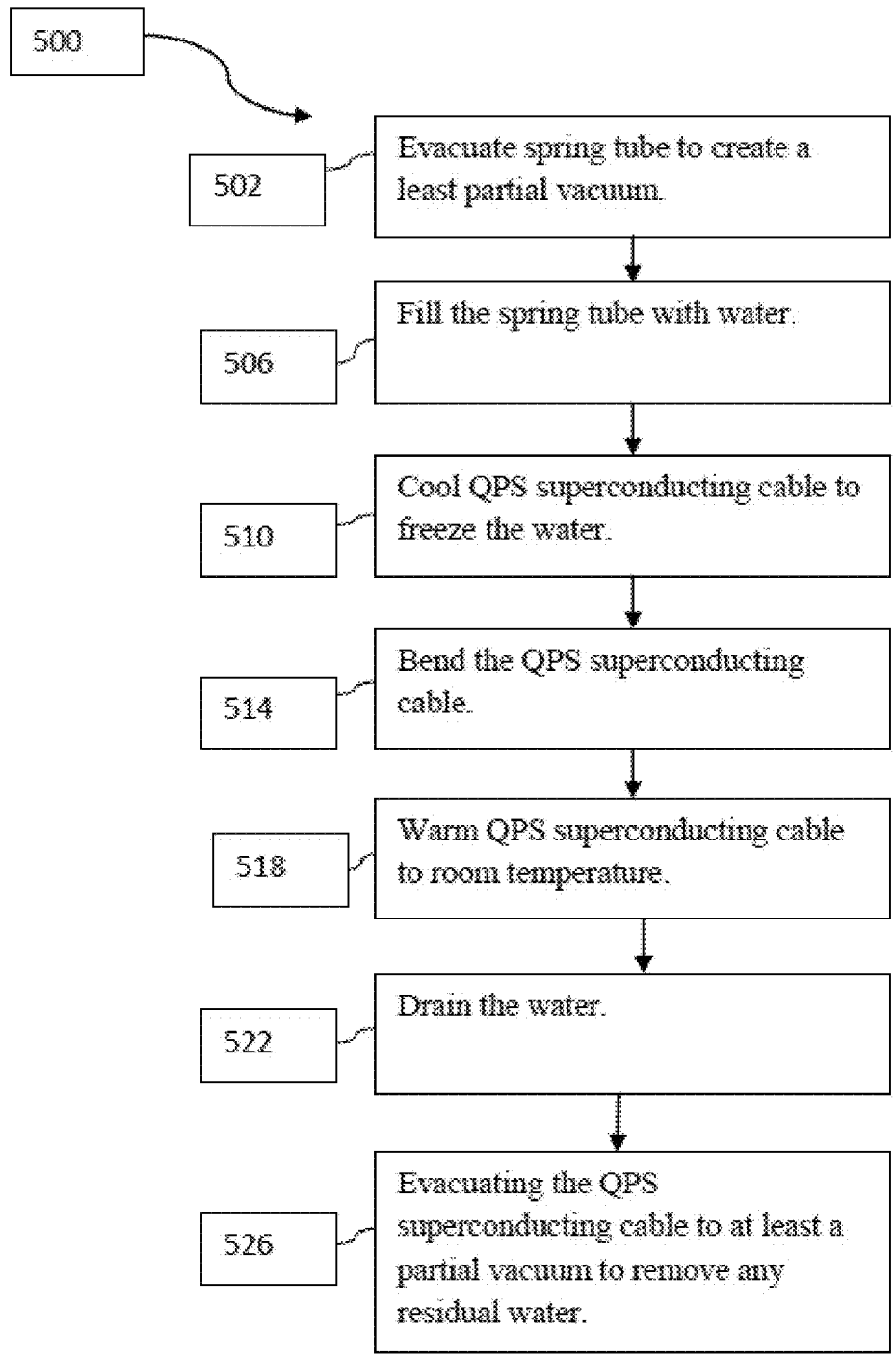
FIG. 4 shows a flow diagram of a process for bending a QPS superconducting cable according to an embodiment of the subject invention.

Many applications using the QPS superconducting cable require the QPS superconducting cable to be bent. FIG. 4 shows a flow diagram of a process for bending a QPS superconducting cable according to an embodiment of the subject invention. In an embodiment, the QPS superconducting cable can be bent to any required angle (e.g., 180°) with a small radius of curvature, minimal to no deformation, and little to no crushing of the internal components or geometry of the QPS superconducting cable. Referring to FIG. 4, a spring tube can be evacuated to create at least a partial vacuum 502. The spring tube can then be filled with a liquid (e.g., an aqueous solution or water) 506. In a specific embodiment, the spring tube can be filled with liquid throughout its length using a syringe and a long flexible tube so that the liquid is inserted into the middle of the spring tube and excludes air towards both ends. Such a procedure avoids or limits trapping bubbles, which could produce a local stress concentration and collapse of the QPS superconducting cable during bending. When the QPS superconducting cable is filled with liquid (e.g., water), at least a portion of the liquid can be purged with agitation and a mild vacuum can be applied to fill the liquid into the interstitial space (116). The QPS superconducting cable can be cooled to freeze the liquid 510. The QPS superconducting cable can then be bent to the desired angle 514. The QPS superconducting cable can then be warmed (e.g., to room temperature). The liquid can then be drained from the QPS superconducting cable 522. A vacuum (or partial vacuum) can then be used to at least partially evacuate the QPS superconducting cable to remove any residual liquid from the QPS superconducting cable 526. Though FIG. 4 mentions water as the liquid, this is in an exemplary embodiment and should not be construed as limiting.

In a specific embodiment, 180° bends were made with a bend radius of 32 mm in a QPS superconducting cable with a sheath radius of 4.5 mm, giving a ratio of 7:1 (bend radius:sheath radius). The ratio of bend radius (radius of curvature) to sheath radius can be, for example, any of the following values, about any of the following values, at least any of the following values, at least about any of the following values, not more than any of the following values, not more than about any of the following values, or within any range having any of the following values as endpoints (with or without "about" in front of one or both of the endpoints), though embodiments are not limited thereto (all numerical values are dimensionless): 20:1, 19:1, 18:1, 17:1, 16:1, 15:1, 14:1, 13:1, 12:1, 11:1, 10:1, 9:1, 8:1, 7:1, 6:1, 5:1, 4:1, 3:1, or 2:1, though embodiments are not limited thereto. For example, in many embodiments, the ratio of bend radius (radius of curvature) to sheath radius is 7:1 or less.

In an embodiment, a method of fabricating a QPS superconducting cable can include fabricating the cable as described by individually fabricating the components (or collectively fabricating some or all of the components and separately fabricating others, individually or collectively). The components can then be combined, and the sheath can be provided around the superconducting wires and the spring tube (and in some cases the quench heater wires.

Figure 12:
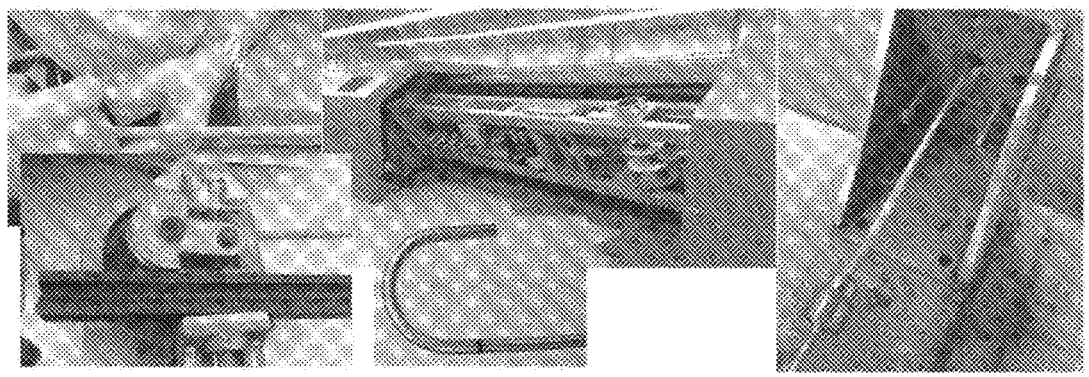
FIG. 12 shows images of fabricating a QPS superconducting cable according to an embodiment of the subject invention.

FIG. 12 shows images of fabricating a QPS superconducting cable according to an embodiment of the subject invention. Referring to FIG. 12, in an embodiment, superconducting wires can be twist-pitch cabled onto a spring tube (top left). CTFF can be performed to provide the sheath (bottom left). The sheath tube can be drawn down onto the cable to compress the wires against the spring tube, and the QPS cable can be bent to 180°. The inset shows the finished bend.

QPS superconducting cables of embodiments of the subject invention, as well as the methods of fabricating the same and bending the same, can be advantageously used in many different applications. For example, a QPS superconducting cable as described herein can be used: in a dipole magnet (e.g., a 4.5 T dipole magnet); as compact beam gantries for use in proton beam cancer therapy; in magnetic energy storage systems; in transmission lines; and to form high strength structured cable for multi-turn windings with large hoop stress.

In an embodiment of the subject invention, quench protection can be provided by an external heater at the ends of all turns. This can be used, for example, in a winding for cables used in high-stored-energy magnets in which the quench velocity is fast (e.g., NbTi), so that the length of cable for each quench heater is kept minimum.

In an embodiment, quench protection can be provided via a plurality of quench heater wires (e.g., a layer of insulated quench heater wires) cabled with the superconducting wires, so that quench can be forced simultaneously everywhere. This can be used, for example, in a winding for windings in which the quench velocity is slow (e.g., $Nb_3Sn$, $MgB_2$, Bi-2212).

In an embodiment, a high-power transmission line can include QPS superconducting cables as disclosed herein (e.g., three cables) that can be supported within a corrugated vacuum shell, with provision for high dielectric strength among cables, in a geometry that is robust but flexible.

For windings that are expected to experience large mechanical forces (e.g., solenoid and tokamak windings), the structure can be designed to incorporate a resistive (e.g., paper) insulating sheath and/or a support spider with high compressive strength but significant flexibility for winding. The twist pitch of the wire and the cylindrical shell geometry of the cable can naturally minimize AC losses for applications that require cyclic or alternating current in the windings.

The subject invention includes, but is not limited to, the following exemplified embodiments.

Embodiment 1

A quench protected structured (QPS) superconducting cable, comprising:

a spring tube;

a plurality of superconducting wires disposed around the spring tube; and a sheath surrounding the plurality of superconducting wires and the spring tube, wherein the spring tube comprises a plurality of perforations.

Embodiment 2

The QPS superconducting cable according to embodiment 1, wherein the sheath is applied using a continuous tube forming technique.

Embodiment 3

The QPS superconducting cable according to embodiment 2, wherein the continuous tube forming technique is the technique of U.S. Pat. No. 6,687,975.

Embodiment 4

The QPS superconducting cable according to any of embodiments 1-3, further comprising a plurality of quench heater wires, wherein each quench heater of the plurality of quench heater wires is a resistive wire that generates heat as current passes through it.

Embodiment 5

The QPS superconducting cable according to embodiment 4, wherein the plurality of quench heater wires are distributed among the plurality of superconducting wires within the sheath.

Embodiment 6

The QPS superconducting cable according to embodiment 4, wherein the plurality of quench heater wires are provided external to the sheath.

Embodiment 7

The QPS superconducting cable according to embodiment 6 wherein the plurality of quench heater wires are distributed on an outer surface of the sheath.

Embodiment 8

The QPS superconducting cable according to any of embodiments 1-7, wherein the plurality of superconducting wires are cabled with a twist pitch around the spring tube and are confined within the sheath.

Embodiment 9

The QPS superconducting cable of any of embodiments 1-8, wherein the spring tube is filled with a cryogen that passes through the plurality of perforations in the spring tube and thereby fills interstitial space between the sheath and the plurality of superconducting wires.

Embodiment 10

The QPS superconducting cable according to any of embodiments 1-9, wherein the plurality of superconducting wires includes at least one of the following materials: NbTi/Cu; $Nb_3Sn$/Cu; Bi-2212/Ag; $MgB_2$/Monel; ferropnictide; Bi-2223; YBCO; and rare-earth-based barium carbonates (ReBCO).

Embodiment 11

The QPS superconducting cable according to any of embodiments 1-10, wherein each superconducting wire of the plurality of superconducting wires is cylindrical.

Embodiment 12

The QPS superconducting cable according to any of embodiments 1-10, wherein each superconducting wire of the plurality of superconducting wires is a flat ribbon.

Embodiment 13

The QPS superconducting cable according to any of embodiments 1-12, further comprising at least one layer of thermally conducting and electrically insulating tape spiral-wrapped around the plurality of superconducting wires and the spring tube (and the plurality of quench heater wires, if present and within the sheath) within the sheath.

Embodiment 14

The QPS superconducting cable according to any of embodiments 1-13, further comprising a plurality of resistive wires cabled with the plurality of superconducting wires so that a first resistive wire of the plurality of resistive wires is located at a V-crevice formed between two contiguous superconducting wires of the plurality of superconducting wires, so that a radius of an outermost point on the first resistive wire from the center of the cable equals the radius of an outermost point on the two contiguous superconducting wires.

Embodiment 15

The QPS superconducting cable according to embodiment 14, wherein the plurality of resistive wires is equal in number to the plurality of superconducting wires.

Embodiment 16

The QPS superconducting cable according to any of embodiments 14-15, wherein the plurality of resistive wires is coated with an insulator.

Embodiment 17

The QPS superconducting cable according to any of embodiments 14-16, wherein each resistive wire of the plurality of resistive wires comprises a metal alloy.

Embodiment 18

The QPS superconducting cable according to embodiment 17, wherein the metal alloy comprises stainless steel of Monel.

Embodiment 19

The QPS superconducting cable according to any of embodiments 16-18, wherein the insulator is a uniform film of any of a ceramic, a glass, and a polymer.

Embodiment 20

The QPS superconducting cable according to any of embodiments 1-19, wherein the sheath comprises any one of: a fiber-glass cloth; and a fiberglass tape applied to an outer surface of the plurality of superconducting wires.

Embodiment 21

A method of bending a QPS superconducting cable according to any of embodiments 1-20, wherein the method comprises the steps of:

evacuating the spring tube to create at least a partial vacuum;
filling the spring tube with a liquid;
cooling the QPS superconducting cable to freeze the liquid;
bending the QPS superconducting cable;
warming the QPS superconducting cable to room temperature;
draining the liquid; and
evacuating the QPS superconducting cable to at least a partial vacuum to remove any residual liquid.

Embodiment 22

The method according to embodiment 21, wherein the liquid is water.

Embodiment 23

The method according to any of embodiments 21-22, further comprising using a forming die to minimize sideways deformation.

Embodiment 24

The method according to any of embodiments 21-23, wherein bending the QPS superconducting cable comprises bending the QPS superconducting cable to an angle of at least 90°.

Embodiment 25

The method according to any of embodiments 21-24, wherein bending the QPS superconducting cable comprises bending the QPS superconducting cable to an angle of 180° or about 180°.

Embodiment 26

The method according to any of embodiments 21-25, wherein a ratio of radius of curvature ($r_c$) of the bend to sheath radius ($r_s$) ($r_c$:$r_s$) is 7:1 or less.

Embodiment 27

A method of compacting a sheath of a QPS superconducting cable according to any of embodiments 1-20, wherein the method comprises:
drawing the sheath through a forming die in a succession of reducing deformations until the plurality of superconducting wires (and the plurality of quench heater wires, if present and within the sheath) compress the spring tube by a small displacement so that each of the plurality of superconducting wires (and the plurality of quench heater wires, if present and within the sheath) are immobilized in an annular space between the sheath and the spring tube, and each of the neighboring wires of the plurality of superconducting wires (and the plurality of quench heater wires, if present and within the sheath) are compacted against one another so that a controlled electrical contact is established among the neighboring wires of the plurality of superconducting wires (and the plurality of quench heater wires, if present and within the sheath).

Embodiment 28

A C dipole electromagnet, in which two windings of a QPS superconducting cable according to any of embodiments 1-20 (and possibly bent according to the method of any of embodiments 21-25) are assembled onto a central mandrel containing a hollow interior including two hollow interior channels connected by a narrow slot aperture, so that when current is passed through the windings an approximately homogeneous magnetic field is produced inside one of the interior channels.

Embodiment 29

The electromagnet according to embodiment 28, wherein the central mandrel contains sufficient structural strength to form an H-beam bridge to support the vertical compressive force produced by the magnetic field acting back on the two windings so that the narrow slot aperture is supported sufficiently that it deflects by an acceptably small amount.

Embodiment 30

A dipole beam transpolt channel, in which two windings of a QPS superconducting cable according to any of embodiments 1-20 (and possibly bent according to the method of any of embodiments 21-25) are assembled onto a central mandrel containing a hollow interior channel, so that when current is passed through the windings an approximately homogeneous magnetic field is produced inside the interior channel.

Embodiment 31

A quadrupole beam transport channel, in which four windings of a QPS superconducting cable according to any of embodiments 1-20 (and possibly bent according to the method of any of embodiments 21-25) are assembled onto a central mandrel containing a hollow interior channel, so that when current is passed through the windings an approximately symmetric quadrupole magnetic field is produced inside the interior channel.

Embodiment 32

A combined-function transport channel, in which the four windings of embodiment 31 are assembled onto the two windings of embodiment 30 to produce a superposition of dipole and quadrupole field inside the interior channel.

Embodiment 33

A solenoid magnet, in which the insulated sheathed cable of embodiment 28 is wound onto a mandrel in a cylinder that contains a mold-release film on its outer surface and a slot and spreader bracket so that the mandrel can later be removed, then the winding is heat-treated if necessary while supported on the mandrel, then an outer split cylinder metal shell is assembled onto the winding and pulled together to form a snug compressive fit, then the split in the shell is welded so that the shell provides a compressive containment of the winding, then the void spaces of the winding are vacuum impregnated, and the removable mandrel is collapsed and removed.

Embodiment 34

A transmission line, in which three insulated sheathed QPS superconducting cables according to any of embodiments 1-20 are supported in parallel in a triangular array and contained within a metal enclosure.

Embodiment 35

The transmission line according to embodiment 34, wherein each insulated sheathed cable is wrapped with a spiral wrap of multiple layers of an electrically insulating paper or polymer.

Embodiment 36

The transmission line according to any of embodiments 34-35, wherein the three insulated sheathed cables are supported by a row of reinforced polymer brackets, each bracket comprising a semi-rigid pattern of ribs that support the cables in the triangular geometry with respect to one another and with equal spacing from the inner walls of the cylindrical metal shell.

Embodiment 36

The transmission line according to any of embodiments 34-35, wherein the metal enclosure contains two concentric cylindrical metal shells, the inner shell comprising an overlapping interlocking spiral flex tube, the outer one comprising a flexible metal bellows tube that is hermetic to contain vacuum.

Embodiment 37

The QPS supporting cable according to any of embodiments 1-20, wherein the cable is an insulated sheathed cable in which the spring tube is a support spider containing a central hole for cryogen flow and a multiplicity of open-side support channels (perforations), wherein insulated sheathed cables are inserted from the side into the support channels, a conformal shoe is place over the outside of each cable, the assembly is pulled through the sheath tube, and the sheath tube is drawn down onto the support spider so that each cable is immobilized within its support channel.

A greater understanding of the present invention and of its many advantages may be had from the following examples, given by way of illustration. The following examples are illustrative of some of the methods, applications, embodiments and variants of the present invention. They are, of course, not to be considered as limiting the invention. Numerous changes and modifications can be made with respect to the invention.

Example 1

Figure 5:
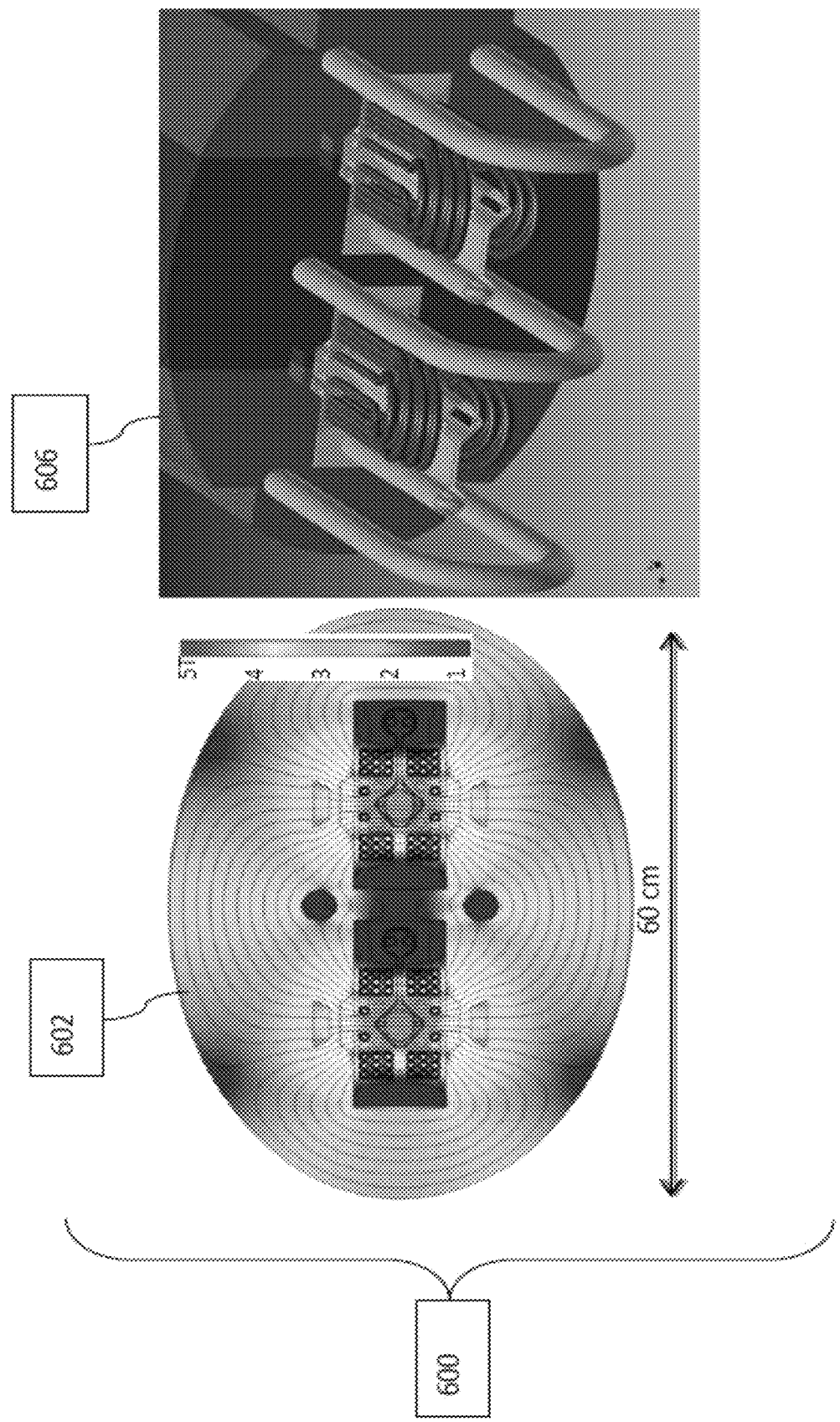
FIG. 5 shows a cross-sectional view and a schematic view of a QPS superconducting cable applied to be used in a dipole.

A QPS superconducting cable as described herein was fabricated, wherein the superconducting wires included NbTi, and used for a 4.5 Tesla (T) dipole magnet as a basis for a 100 tera-electronvolt (TeV) hadron collider. FIG. 5 shows a cross-sectional view (left) and schematic view (right) of the 4.5 T superferric dipole using pancake QPS windings. Referring to FIG. 5, the 4.5 T superferric dipole 600 was designed, using the QPS superconducting cable, as a cost-minimum basis for building a 100 TeV hadron collider for high energy physics research. Each dipole 600 was configured in a C geometry 606 so that the horizontal fan of synchrotron radiation exited the beam tube through a slot aperture and could be absorbed in a separately cooled radiation channel. The radiation channel contained NEG vacuum pumping and was cooled at about 150 K by separate cooling tubes so the about 20 Watts per meter per bore (W/m/bore) of synchrotron radiation heat could be removed without major power requirement.

Figure 6:
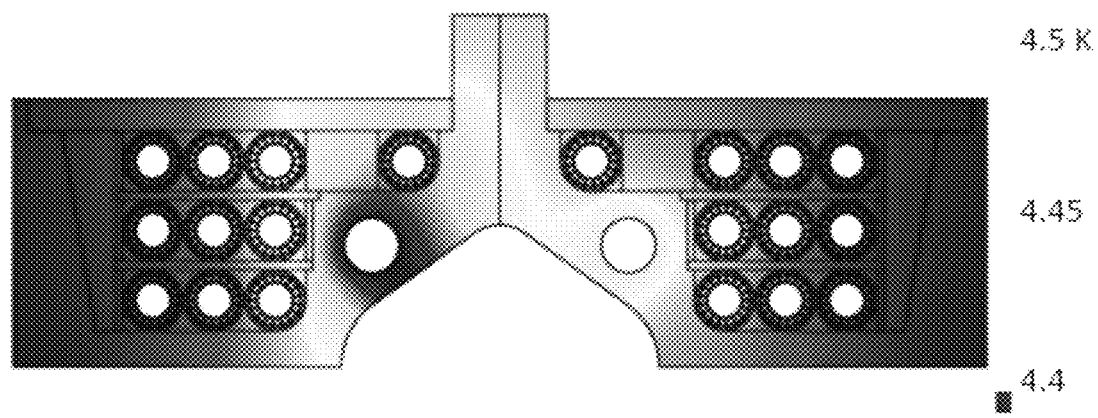
FIG. 6 shows a simulation of heat transfer within the coils of the dipole shown in FIG. 5.
Figure 7:
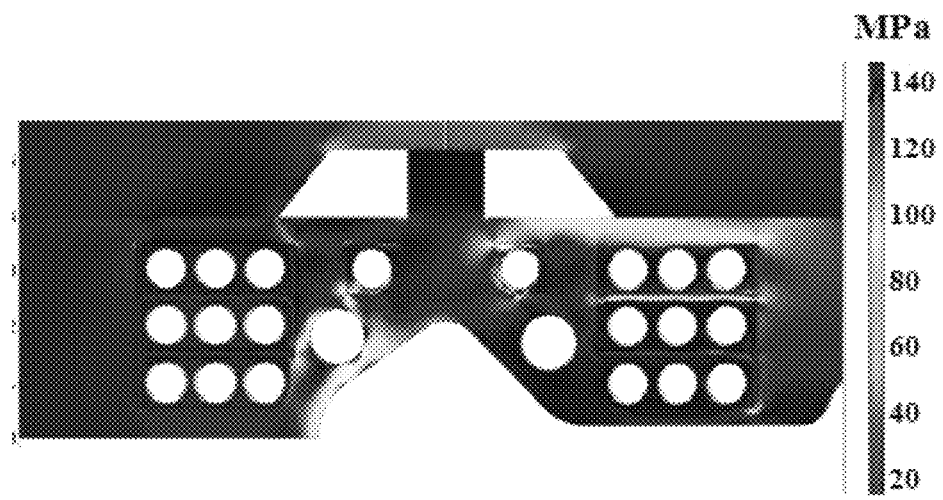
FIG. 7 depicts a simulation of the von Mises stress in a winding of the dipole shown in FIG. 5.

By separating the heat from synchrotron light and the associated gas desorption from the beam tube, their effects could be removed from the circulating beam that could otherwise limit the achievable luminosity. The principle parameters of the dipole are summarized in Table 2. For a dipole field strength of 4.5 T, the C geometry 606 requires no more superconductor than would a conventional dipole. The windings for each dipole were fabricated from two lengths of QPS superconducting cable as demonstrated in FIG. 5 (606). The magnetic design supports 5.0 T short-sample field, and operated at 4.5 T with 20 kilo-amp (kA) coil current. FIG. 6 shows the simulated temperature distribution in the windings in the presence of the heat deposition from beam losses in the 100 TeV hadron collider. The cryogen flowing through the QPS cable is crucial to prevent or inhibit temperature gradients. FIG. 7 shows the calculated stress distribution in the impregnated windings of the QPS-based dipole. The stress management provided by the sheaths prevents or inhibits stress damage to the cables.

TABLE 2

| Principle parameters of the dipole | | |
|---|---|---|
| Operating bore field | 4.5 | T |
| # turns | 20 | |
| NbTi/Cu wire diameter | 1.2 | mm |
| Operating current | 20 | kA |
| Short-sample bore field | 5.0 | T |
| Physical aperture | 3.5 × 2.5 | $cm^2$ |
| Dipole length | 20 | m |
| Inductance | 0.3 | mH/m |
| Stored energy | 63 | kJ/m |
| LHe flow in windings | 32 | $cm^3/s$ |
| Operaturing temperature | 4.2-4.3 | K |
| Max temp in quench | 115 | K |

Example 2

A QPS superconducting cable as described herein was fabricated, wherein the superconducting wires included $MgB_2$, and used for compact beam gantries for proton beam therapy (PBT) for cancer. PBT provides localized dose (Bragg peak) to kill cancer cells in a tumor with minimum collateral damage to surrounding healthy tissue. This beneficial technique has remarkable results and is a rapidly growing method for cancer therapy. The biggest challenges to its broader adoption are its capital cost and the time required to treat each patient. Cost is dominated by the size and mass of the beam transport gantries. Treatment time is complicated by the difficulty in tuning the transport optics over a stepped range of proton energies.

Many different designs have been proposed for superconducting beam transport and gantries for PBT. They share two limitations that have thus far inhibited their development into practice. First, most designs utilize a NbTi superconductor that requires liquid helium refrigeration. Such refrigeration is expensive, inefficient, and problematic for use on a rotating gantry. Second, energy stepping requires rapid re-tuning of the gantry for a progression of momenta, and rapid stepping of superconducting magnets is limited by alternating current losses and stepping transients.

Figure 13:
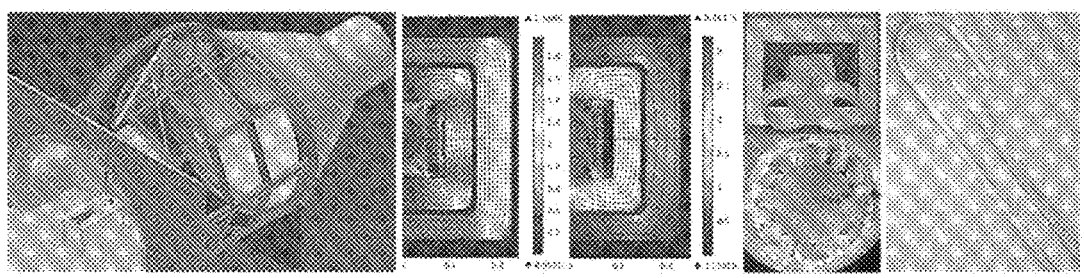
FIG. 13 shows images of QPS superconducting cables according to embodiments of the subject invention.

A QPS superconducting cable according to an embodiment of the subject invention was used to design a superconducting magnet and a beam transport lattice for the beam gantry that addresses the foregoing limitations. The QPS superconducting cable based dipole/quadrupole beam transport magnet integrates the bending and focusing elements of beam transport in a common magnetic envelope. The QPS superconducting cable based dipole/quadrupole uses the QPS superconducting cable conductor and persistent switch/ flux pump current management to make a stand-alone, low-mass beam transport system with integrated cryo-cooler. The QPS superconducting cable based design supports optimum, compact optics for pencil-beam therapy and rapid energy stepping. Several factors make these magnets ideal for PBT optics. First, the gantry has ⅕ the mass of conventional optics: about 10 tons for full gantry versus greater than 50 tons. Second, the $MgB_2$ QPS windings integrate 15 K He gas cooling within the cable, dramatically reducing the cost and complexity of cryogenics. Third, the dipole bends and quadrupole focusing are integrated to provide compact, achromatic, sharp-focus 2-D-scan optics over a wide focal field. Fourth, a flux-pump and fast-energy-stepping (FP/ES) power source eliminates expensive high-current supplies and provides about 10 step/second energy modulation for 3-D rastering. Two gantry magnets fashioned from QPS superconducting cable were designed: a 2 T field with a 1.2 m bend radius for 250 MeV proton therapy, and a 3 T field with 2.2 m bend radius for 450 MeV/c $C^{6+}$ therapy. FIG. 13 shows images of the gantry for C6+ therapy (left), quadrupole windings providing focusing optics (second from left), dipole field providing bending (third from left), flair ends of the CIC windings and the CIC cable cross section (fourth from left), and the CIC cable bent 180 degrees to show mechanical and electrical integrity (right).

Example 3

Figure 8B:
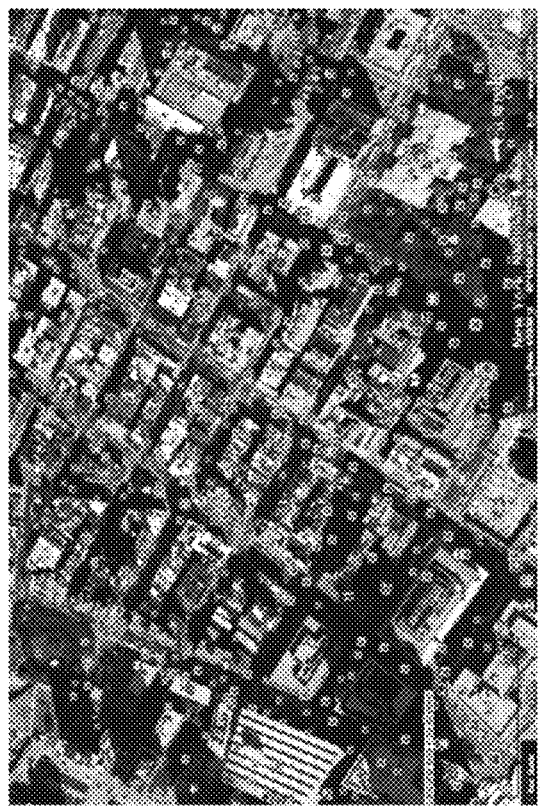
FIG. 8B shows an overhead image of the financial district in New York City.
Figure 8A:
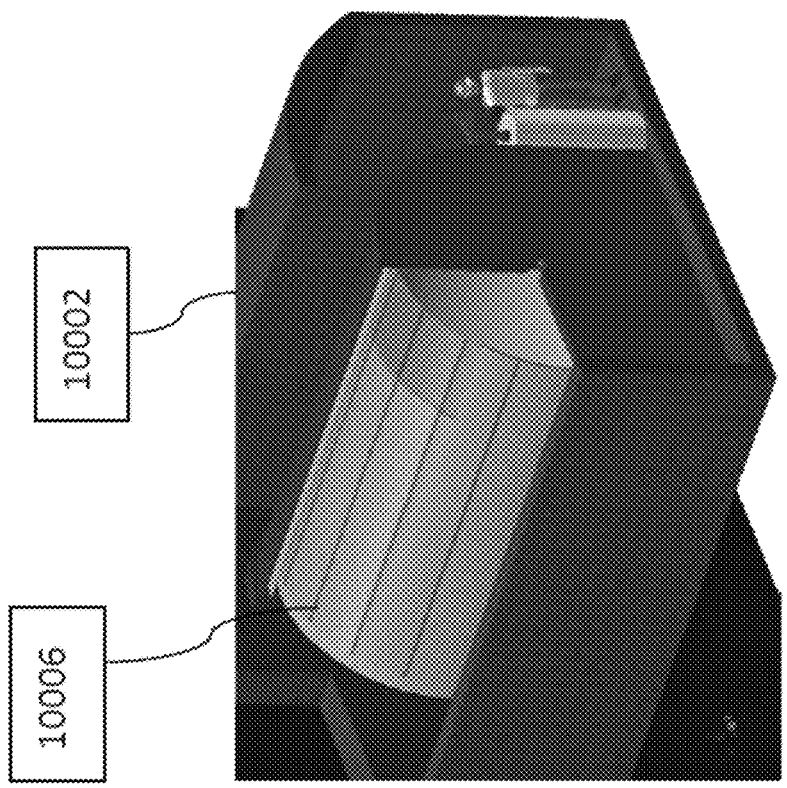
FIG. 8A shows a schematic view of a QPS superconducting cable according to an embodiment of the subject invention used for superconducting magnet energy storage.

A QPS superconducting cable as described herein was fabricated and used for a superconducting magnetic energy storage (SMES) unit. FIG. 8A shows a schematic view of an SMES unit fashioned from a QPS superconducting cable according to an embodiment of the subject invention. Referring to FIG. 8A, the SMES unit 1002 included an end-connected string of solenoid modules, with a wedge-shaped steel plate on each end. The SMES unit 1002 can connect 64 modules, each with a radius of 3 meters and a length of 4 meters, to form a 45-m radius toroid. Using a single layer of QPS superconducting cable containing 25 $MgB_2$ superconducting wires, the unit operated at 3 T bore field, contained N=200 turns of cable carrying 50 kA of current, and stored 2 megawatt-hours (MWh) of field energy. The choice of 3 T field requires a much larger footprint for a given stored energy, but it makes many aspects of construction and operation dramatically simpler than for any high-field SMES design. One of the most important issues for stable operation of the coil is the outward magnetic pressure produced by the Lorentz force of the field acting on the winding: $S=B^2/(2\mu o)=3.6$ MPa.

That force would produce unacceptable strain in the QPS superconducting cable if the QPS superconducting cable were unsupported. However, as designed, the QPS superconducting cable was supported within a 7-cm thick cylindrical aluminum shell (gray), which was closed and welded over the finished coil to make a snug fit to the helical winding. Aluminum contracts more when it is cooled to cryogenic temperature than does the Monel-sheathed QPS superconducting cable (a fractional differential of about 0.001) so that it actually preloads the winding under compression. When the winding is energized to full current, the Lorentz load produces a strain in the aluminum of about 0.001, which cancels the preload but leaves the coil without any strain degradation. Quench protection was provided by 16 quench heater wires 1006, thermally sunk to all windings. FIG. 8B shows an overhead image of the financial district in New York City, with locations of two parks circled (upper left and lower right), each park having a tunnel with an SMES unit located therein.

Example 4

Figure 9B:
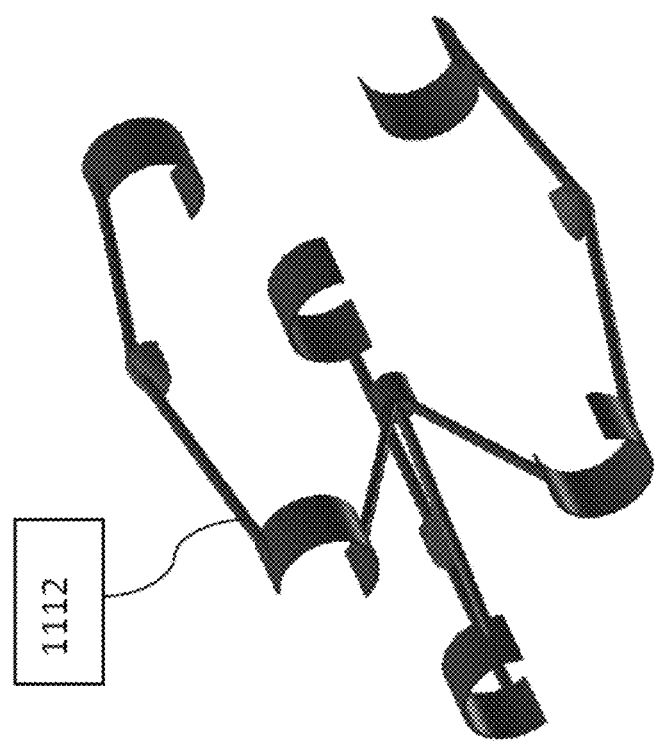
FIG. 9B shows a schematic view of a QPS superconducting cable according to an embodiment of the subject invention used for a high-power transmission line.
Figure 9A:
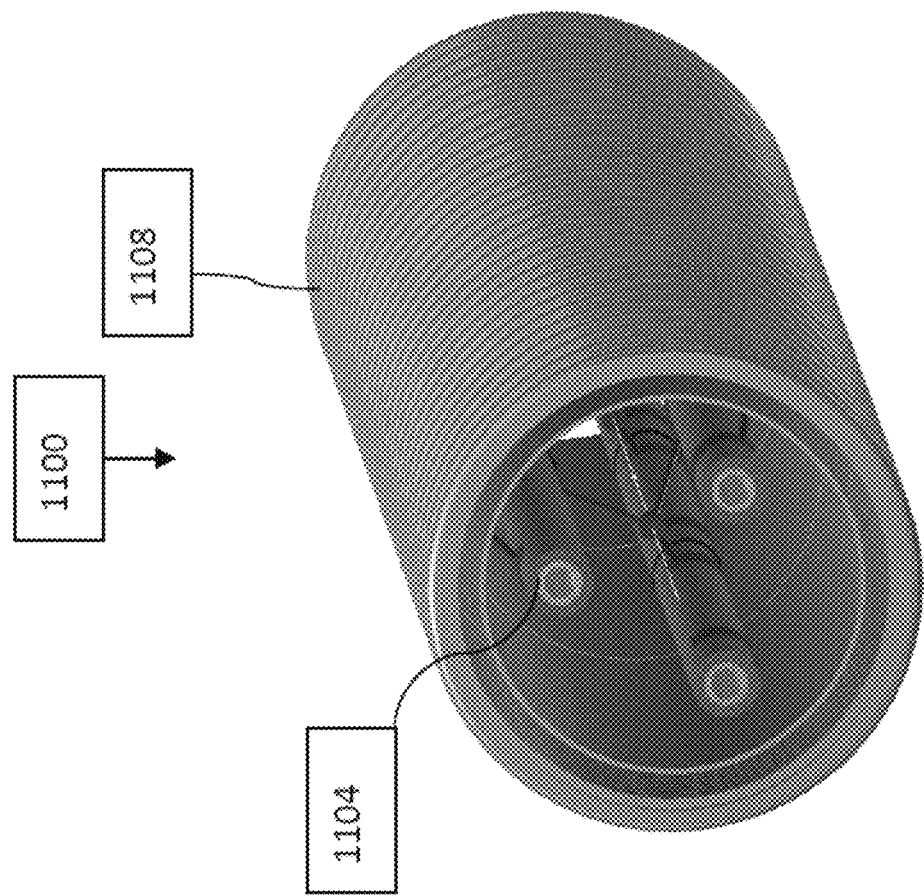
FIG. 9A shows a schematic view of a QPS superconducting cable according to an embodiment of the subject invention used for a high-power transmission line.

A QPS superconducting cable as described herein was fabricated and used for a high power transmission line. Superconducting transmission lines for high-power alternating current (AC) and direct current (DC) connection of electric grids have been a long-standing goal of development. FIGS. 9A and 9B show a superconducting transmission line 1100 based upon QPS superconducting cables 1104 of an embodiment of the subject invention. The QPS superconducting cables 1104 operated at 20 K, and the QPS superconducting cables 1104 were cooled by liquid hydrogen operating in a closed-loop cryo-cooler. The required current-carrying performance was accommodated at that temperature using $MgB_2$, and liquid hydrogen is an excellent cryogenic fluid for refrigeration (large heat capacity, and two-phase flow can be taken advantage of). Moreover, a support spider 1112, made of injection-molded powder- or fiber-reinforced polymer, maintained the QPS superconducting cable 1104 geometry with respect to one another and within the flexible QPS superconducting cable 1104. The support spider 1112 is an important element in maintaining flexibility in the finished QPS superconducting cable 1104, so that it can be transported on a spool (radius of about 4 m) and field-installed flexibly. The support spider 1112 helped enable the assembly of three QPS superconducting cables 1104 onto the support spider 1112 as a subassembly, and then the subassembly was slid into the 2-shell outer sheath 1108, the complete assembly 1100 of which is shown in FIG. 9A. Quench protection was provided by cabling quench heater wires along with the superconducting wires, as shown in FIG. 1.

Example 5

The windings of high-field solenoids or toroids typically require many layers of cable turns, wound one upon the other as a capstan. Examples are the high-field toroids and ramped solenoids for tokomaks, and the high-field solenoids for magnetic resonance spectroscopy. The accumulation of hoop compression from capstan winding, coupled with the accumulation of hoop tension from the Lorentz forces on all layers during operation, combine to make a pattern of stress that requires a high-modulus structure distributed within the winding.

Figure 10B:
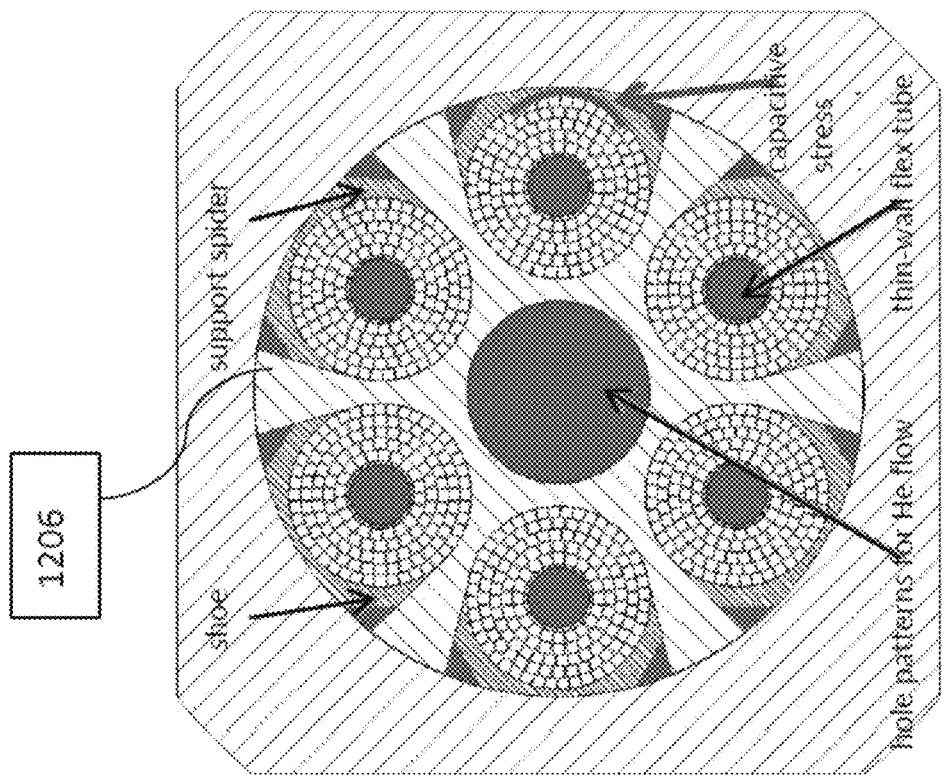
FIG. 10B shows a cross-sectional view of a QPS superconducting cable according to an embodiment of the subject invention.
Figure 10A:
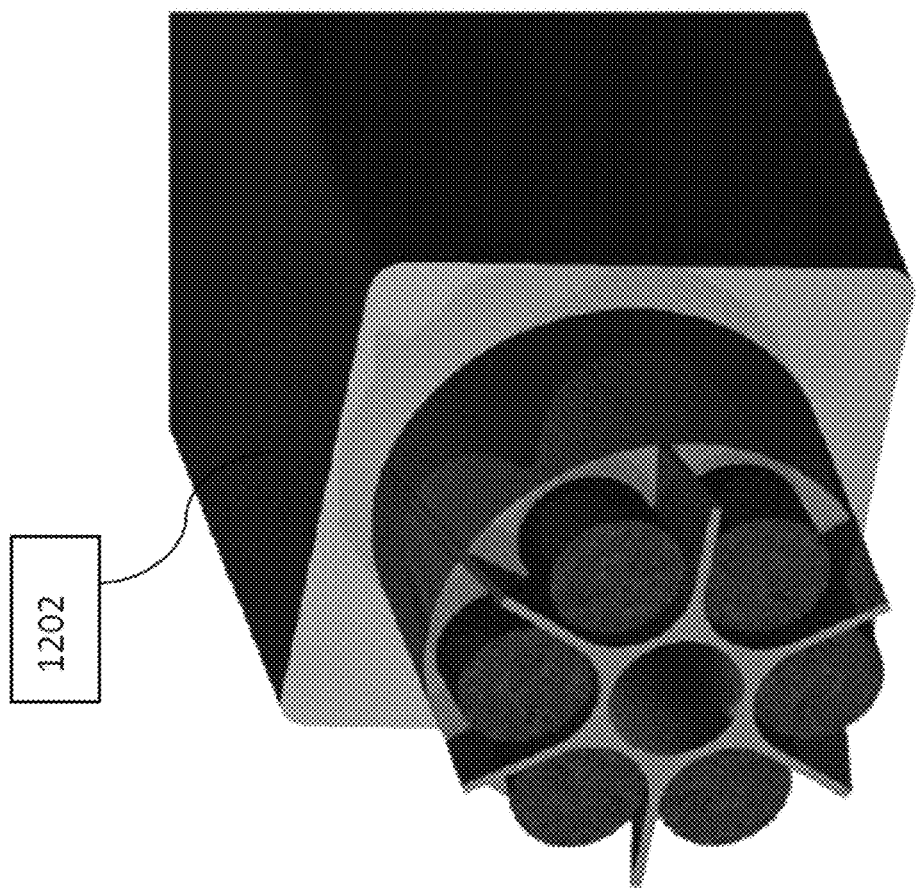
FIG. 10A shows a schematic view of a QPS superconducting cable according to an embodiment of the subject invention.

FIGS. 10A and 10B show a design for a 40 kA QPS superconducting cable 1202 suitable for use in solenoid applications including but not limited to the International Thermonuclear Experimental Reactor (ITER) central solenoid (CS). The strands are the same size as those used in CS, the cable is composed of six 7,500 A sub-cables, and the sub-cables are separately supported within the square armor jacket by means of a support spider in the bore. The support spider was fabricated with a twist pitch suitable for controlling redistribution of charging currents, and the sub-cables were laid into the spider during cabling with twist pitch.

Figure 14:
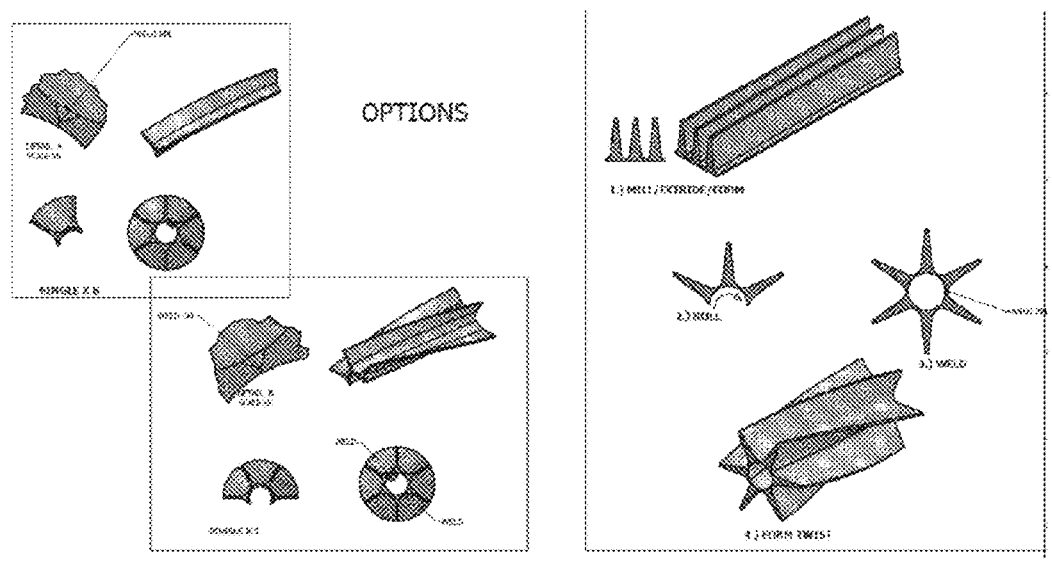
FIG. 14 shows alternative options for forming continuous support spiders.

Two methods were used for cabling the sub-cables. FIG. 10A shows sub-cables that are low-void-fraction ropes 1202. FIG. 10B shows a coherent cabling of nearly square strands around a secondary center tube core 1206. The support spider and the armor jacket can be comprised of 316LN or equivalent high-strength alloy. The spider is highly effective in stiffening the cable against deformation under hoop stress and compressive stress. The support spider can be drilled radially to provide flow channels through which supercritical He can flow between the central flow channel and the sub-cable spaces. If the sub-cables are made by coherent winding, the center tubes within each sub-cable are similarly drilled to provide distributed He flow paths. The shaped strip that supports the cable against the jacket wall can be drilled and given beveled corners to provide He flow channels on the corners 1206. FIG. 14 shows alternative options for forming the continuous support spider from six 316LN T-sections. The T-sections can be fabricated (e.g., in about 6-m lengths), fed to the assembly head at a tilt angle that naturally forms the desired spiral pitch, and the cross-flats of neighboring T-sections can be welded together at the assembly head, either as continuous or section welds. A pattern of He flow channels can be drilled radially through the weld regions to provide for He flow.

Figure 15:
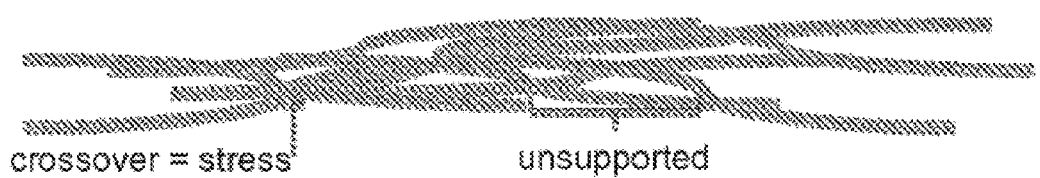
FIG. 15 shows a schematic view of a rope-on-rope configuration.

The ITER CS utilizes a 45 kA $Nb_3Sn$ cable-in-conduit conductor in which the superconducting wires are braded into ropes and the ropes are braided into a rope-on-rope configuration. FIG. 15 shows a schematic view of the rope-on-rope configuration of the ITER CS, demonstrating that each strand crosses over neighbors at random locations and the spacing between crossovers varies stochastically from a few cm to many cm. This arrangement gives rise to two problematic situations: first, each crossover presents a stress concentration where the two strands contact, at which local stress can be large by an order of magnitude than average stresses on strands; second, between successive crossovers, each strand is unsupported. The alternative concept discussed in this example address these issues.

Figure 11:
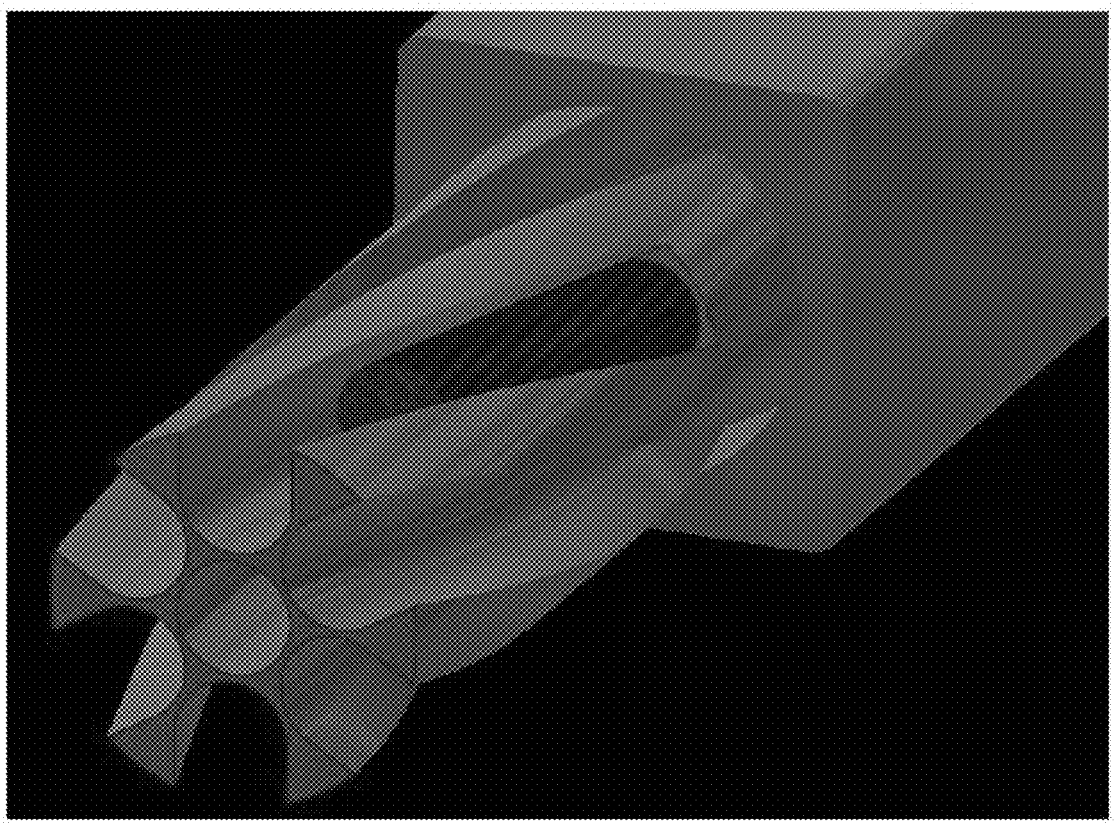
FIG. 11 shows a cross-sectional view of a QPS superconducting cable according to an embodiment of the subject invention.

Prototype cables were tested under cyclic excitation (10,000 cycles total) to simulate the internal strain that is exerted upon strands within a rope-fabricated cable. As depicted in FIGS. 10A and 10B, the high-modulus support spider provides stress management within each QPS superconducting cable so that capstan and hoop stress are supported by the spider and not passed to the QPS superconducting cables within. FIG. 11 shows a method for assembly of the QPS superconducting cable. First, six QPS superconducting cables were fed into their slots in the support spider. Support shoes (red) were located over the open side of each slot, and then the armor jacket was applied, either by welding two clamshells together or by pulling the spider subassembly into segments of cable and drawing the jacket onto the spider subassembly.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein (including those in the "References" section) are incorporated by reference in their entirety, including all figures and tables, to the extent they are not inconsistent with the explicit teachings of this specification.

REFERENCES

U.S. Pat. No. 6,448,501.
U.S. Pat. No. 6,687,975.
International Patent Application Publication No. WO/2014/109803 A2 (2014).
I. R. Dixon et al., Reaction heat treatment and epoxy impregnation of a large $Nb_3Sn$ CICC coil for a series-connected hybrid magnet, IEEE Trans. Appl. Superconductivity 24, 3, 4300505 (2014)
D. Bessette, Design of a $Nb_3Sn$ cable-in-conduit conductor to withstand the 60000 electromagnetic cycles of the ITER Central Solenoid, IEEE Trans. Appl. Superconductivity 24, 3, 4200505 (2014).
D. Mitchell et al., Reversible and irreversible mechanical effects in real cable-ill-conduit conductors, Supercond. Sci. Technol. 26, 114004 (2013).
A. Nijhuis et al., The effect of axial and transverse loading on the transport properties of ITER $Nb_3Sn$ strands, Supercond. Sci. Technol. 26, 084004 (2013).
T. Yagai et al., Investigation of frictional force applied to strands surrounded by other strands and tribological analysis of contact surface in CIC conductor, IEEE Trans. Appl. Superconductivity 24, 3, 8800404 (2014).
K. Kwasnitza, AC losses of a 10 kA NbTi cable-in-conduit superconductor for SMES applications, Cryogenics 36, 1, 27 (1996).
S. A. Lelekhov et al., AC loss before and after cyclic mechanical loading in the ITER RF CICCs, IEEE Trans. Appl. Superconductivity 24, 3, 4201005 (2014).
H. Yumma et al., Update of Yokohama HTS Cable Project, IEEE Trans. Appl. Superconductivity 23, 3, 5402306 (2013).
H. G. Khodzhibagiyan et al., Design and test of a hollow superconducting cable based on keystoned NbTi composite wires, IEEE Trans. Appl. Superconductivity 15, 2, 1529 (2005).
M. N. Wilson, Superconducting Magnets. Ch. 9, Clarendon Press, London, 1983.
D. E. Fischer et al., Superconducting SIS100 prototype magnets, IEEE Trans. Appl. Supercond. 20, 3, 218 (2010).
http://ieeexplore.ieee.org/stamp/stamp.jsp?arnumber=05443653
R. Kersevan, Synchrotron radiation & vacuum concepts', Future Circular Collider Study Kickoff Meeting, Geneva, Feb. 12-14, 2014,
https://indico.cem.ch/event/282344/session/2/contribution/25
http://www.superpower-inc.com/system/files/2011_1012+EPRI+Conf_Brookhaven+SMES.pdf
http:i/www.superpower-inc.com/contentng-hts-wire
http://www.nexans.de/eservice/Germany-de_DE/:fileLibrary/Download_540144810/Germany/files/Nexans_Superconducting_cable_s ystems.pdf
A. Nijhuis et al., Performance of an ITER CSI model coil conductor under transverse cyclic loading up to 40,000 cycles, IEEE Trans. Appl. Superconduct. 14, 2, 1489 (2004).
P. Libeyre et al., An optimized Central Solenoid for ITER, IEEE Trans. Appl. Superconduct. 20, 3, 398 (2010).

What is claimed is:

1. A quench protected structured (QPS) superconducting cable, comprising:
   a spring tube;
   a plurality of superconducting wires disposed around the spring tube;
   a sheath surrounding the plurality of superconducting wires and the spring tube; and
   a plurality of quench heater wires,
   wherein the spring tube comprises a plurality of perforations, and wherein each quench heater wire of the plurality of quench heater wires is a resistive wire that generates heat as current passes through it.

2. The QPS superconducting cable according to claim 1, wherein the plurality of quench heater wires are distributed among the plurality of superconducting wires within the sheath.

3. The QPS superconducting cable according to claim 1, wherein the plurality of quench heater wires are provided external to the sheath.

4. The QPS superconducting cable according to claim 3 wherein the plurality of quench heater wires are distributed on an outer surface of the sheath.

5. The QPS superconducting cable according to claim 1, wherein the superconducting wires of the plurality of superconducting wires are cabled with a twist pitch around the spring tube and are confined within the sheath.

6. The QPS superconducting cable of claim 1, wherein the spring tube is filled with a cryogen that passes through the plurality of perforations in the spring tube and thereby fills interstitial space between the sheath and the plurality of superconducting wires.

7. The QPS superconducting cable according to claim 1, wherein the plurality of superconducting wires includes at least one of the following materials: NbTi/Cu; $Nb_3Sn$/Cu; Bi-2212/Ag; $MgB_2$/Monel; ferropnictide; Bi-2223; YBCO; and rare-earth-based barium carbonates (ReBCO).

8. The QPS superconducting cable according to claim 7, wherein each superconducting wire of the plurality of superconducting wires is cylindrical or is a flat ribbon.

9. The QPS superconducting cable according to claim 2, further comprising at least one layer of thermally conducting and electrically insulating tape spiral-wrapped around the plurality of superconducting wires, the plurality of quench heater wires, and the spring tube within the sheath.

10. A quench protected structured (QPS) superconducting cable, comprising:
a spring tube;
a plurality of superconducting wires disposed around the spring tube; and
a sheath surrounding the plurality of superconducting wires and the spring tube,
wherein the spring tube comprises a plurality of perforations, and
wherein the QPS superconducting cable further comprises a plurality of resistive wires, equal in number to the plurality of superconducting wires, cabled with the plurality of superconducting wires so that a first resistive wire of the plurality of resistive wires is located at a V-crevice formed between two contiguous superconducting wires of the plurality of superconducting wires, so that a radius of an outermost point on the first resistive wire from the center of the cable equals the radius of an outermost point on the two contiguous superconducting wires.

11. The QPS superconducting cable according to claim 10, wherein the plurality of resistive wires is coated with an insulator.

12. The QPS superconducting cable according to claim 10, wherein each resistive wire of the plurality of resistive wires comprises a metal alloy.

13. The QPS superconducting cable according to claim 12, wherein the metal alloy comprises stainless steel of Monel.

14. The QPS superconducting cable according to claim 11, wherein the insulator is a uniform film of any of a ceramic, a glass, and a polymer.

15. The QPS superconducting cable according to claim 1, wherein the sheath comprises any one of: a fiber-glass cloth; and a fiberglass tape applied to an outer surface of the plurality of superconducting wires.

16. The QPS superconducting cable of claim 10, wherein the spring tube is filled with a cryogen that passes through the plurality of perforations in the spring tube and thereby fills interstitial space between the sheath and the plurality of superconducting wires.

17. The QPS superconducting cable according to claim 10, wherein the plurality of superconducting wires includes at least one of the following materials: NbTi/Cu; $Nb_3Sn$/Cu; Bi-2212/Ag; $MgB_2$/Monel; ferropnictide; Bi-2223; YBCO; and rare-earth-based barium carbonates (ReBCO).

18. The QPS superconducting cable according to claim 17, wherein each superconducting wire of the plurality of superconducting wires is cylindrical or is a flat ribbon.

19. The QPS superconducting cable according to claim 10, wherein the sheath comprises any one of: a fiber-glass cloth; and a fiberglass tape applied to an outer surface of the plurality of superconducting wires.

* * * * *